United States Patent
Bach

(10) Patent No.: US 8,072,072 B2
(45) Date of Patent: Dec. 6, 2011

(54) INTEGRATED CIRCUIT INCLUDING DIFFERENT TYPES OF GATE STACKS, CORRESPONDING INTERMEDIATE INTEGRATED CIRCUIT STRUCTURE AND CORRESPONDING INTEGRATED CIRCUIT

(75) Inventor: Lars Bach, Ullersdorf (DE)

(73) Assignee: Qimonda AG, Munich (DE)

( * ) Notice: Subject to any disclaimer, the term of this patent is extended or adjusted under 35 U.S.C. 154(b) by 149 days.

(21) Appl. No.: 11/903,017

(22) Filed: Sep. 20, 2007

(65) Prior Publication Data

US 2009/0078986 A1    Mar. 26, 2009

(51) Int. Cl.
*H01L 23/52* (2006.01)
*H05K 7/00* (2006.01)
(52) U.S. Cl. .............. 257/758; 257/E23.01; 361/718
(58) Field of Classification Search .......... 257/324, 257/758, 786, E23.01, E21.495; 261/718, 261/764, 780
See application file for complete search history.

(56) References Cited

U.S. PATENT DOCUMENTS

| | | |
|---|---|---|
| 2002/0130314 A1 | 9/2002 | Yim et al. |
| 2004/0046210 A1* | 3/2004 | Kang et al. ............... 257/351 |
| 2005/0093047 A1 | 5/2005 | Goda et al. |
| 2005/0157549 A1 | 7/2005 | Mokhlesi et al. |
| 2006/0008992 A1* | 1/2006 | Shukuri .................. 438/264 |
| 2007/0096202 A1* | 5/2007 | Kang et al. ............... 257/324 |
| 2007/0109870 A1* | 5/2007 | Kurata et al. ......... 365/185.28 |
| 2007/0207575 A1 | 9/2007 | Taniguchi et al. |

* cited by examiner

*Primary Examiner* — Thomas L Dickey
*Assistant Examiner* — Nikolay Yushin
(74) *Attorney, Agent, or Firm* — Patterson & Sheridan, LLP

(57) ABSTRACT

The present invention provides a manufacturing method for an integrated circuit and a corresponding integrated circuit. The integrated circuit comprises a plurality of first devices, each first device including a charge storage layer and a control electrode comprising a plurality of layers; and a plurality of second devices coupled to at least one of the plurality of first devices, each second device including a control electrode comprising at least one layer different from said plurality of layers.

14 Claims, 8 Drawing Sheets

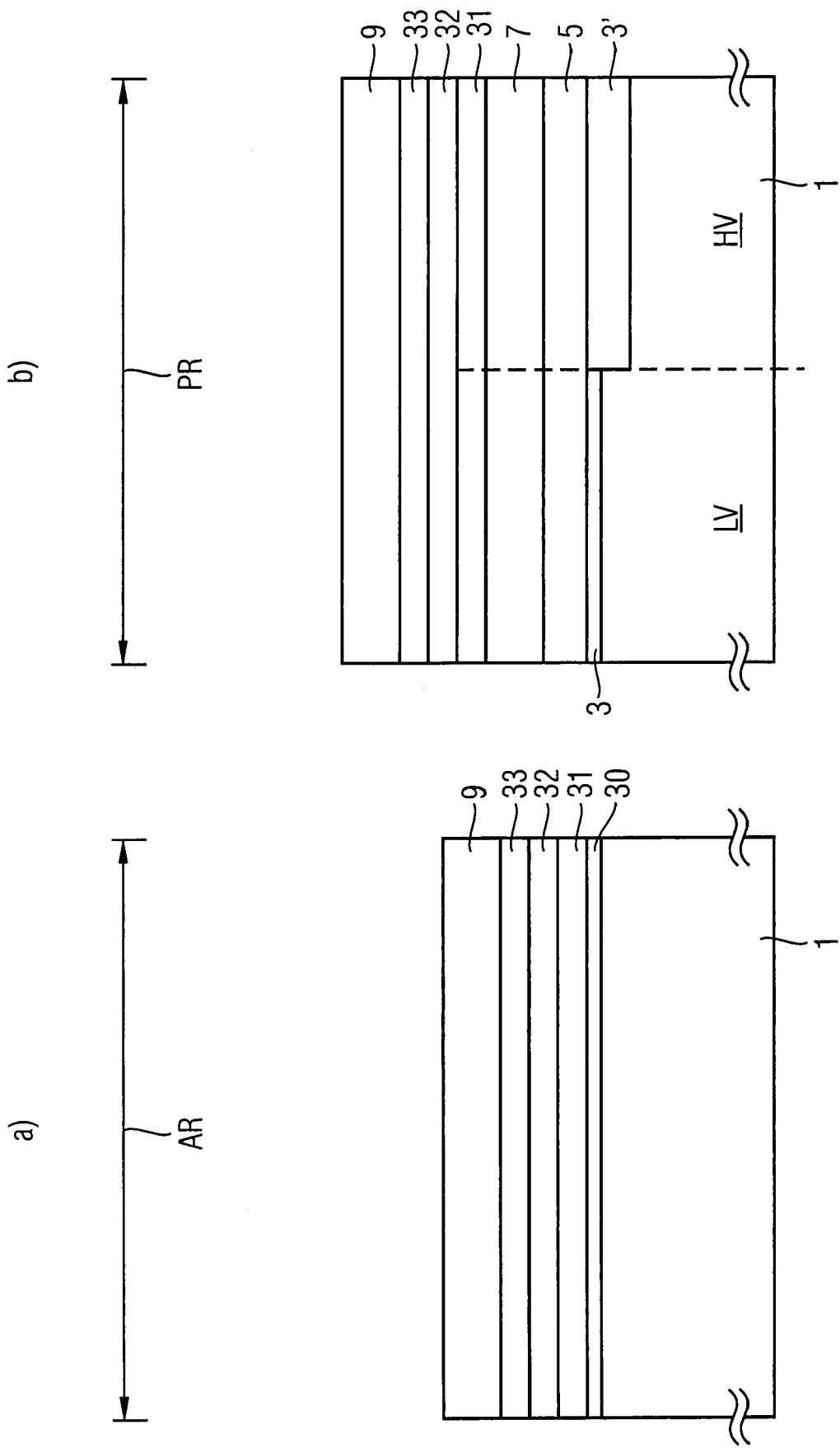

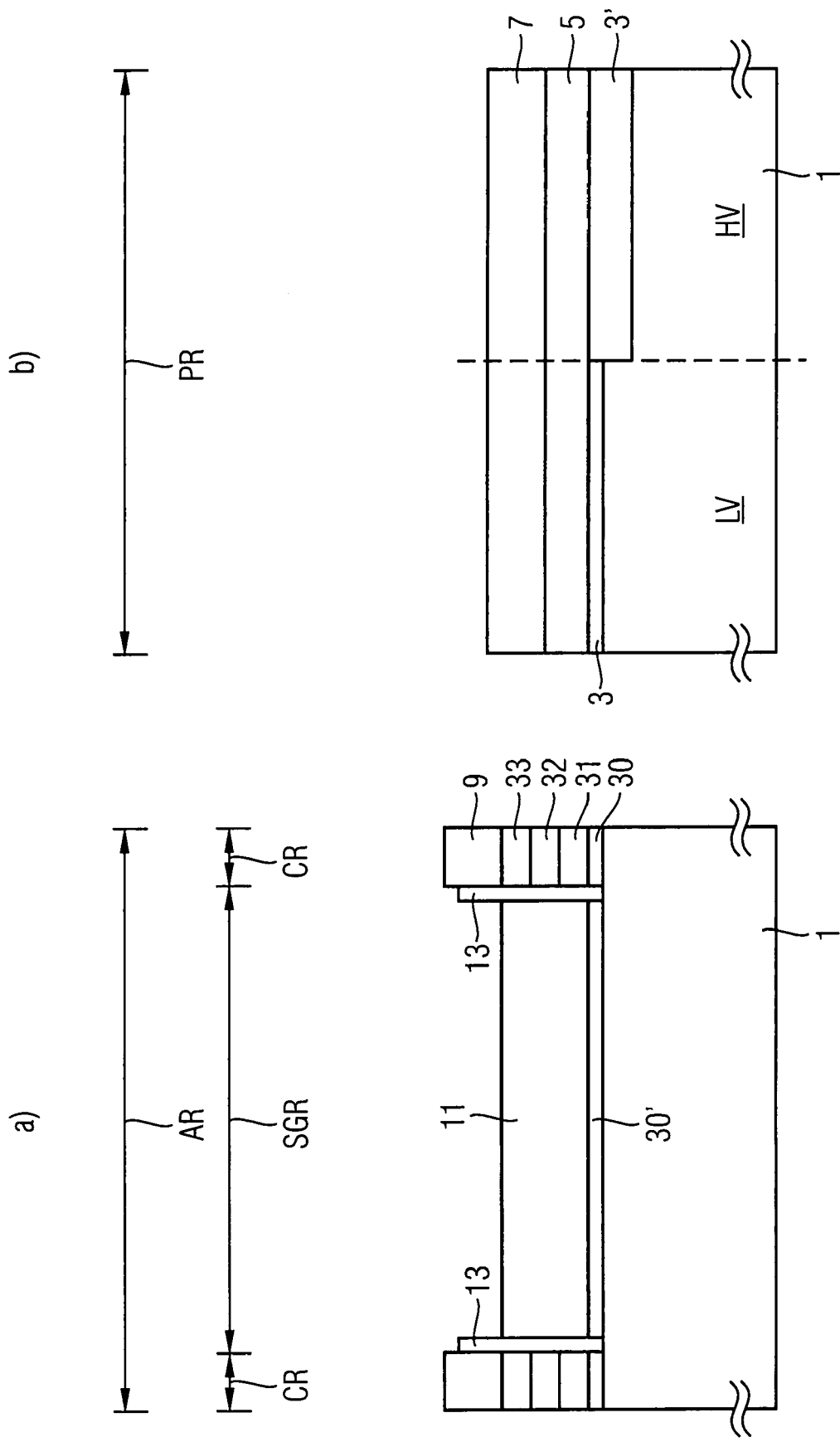

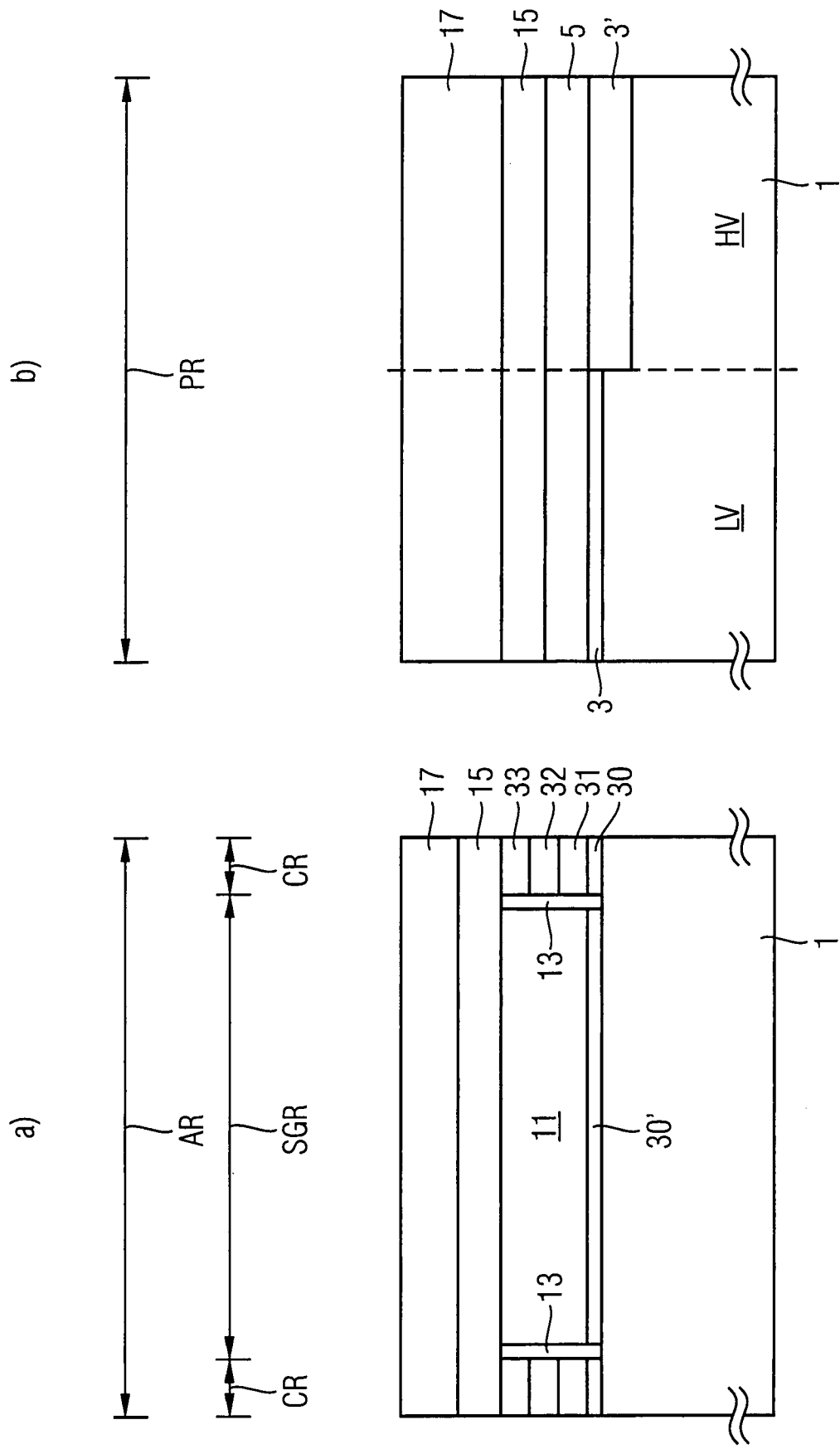

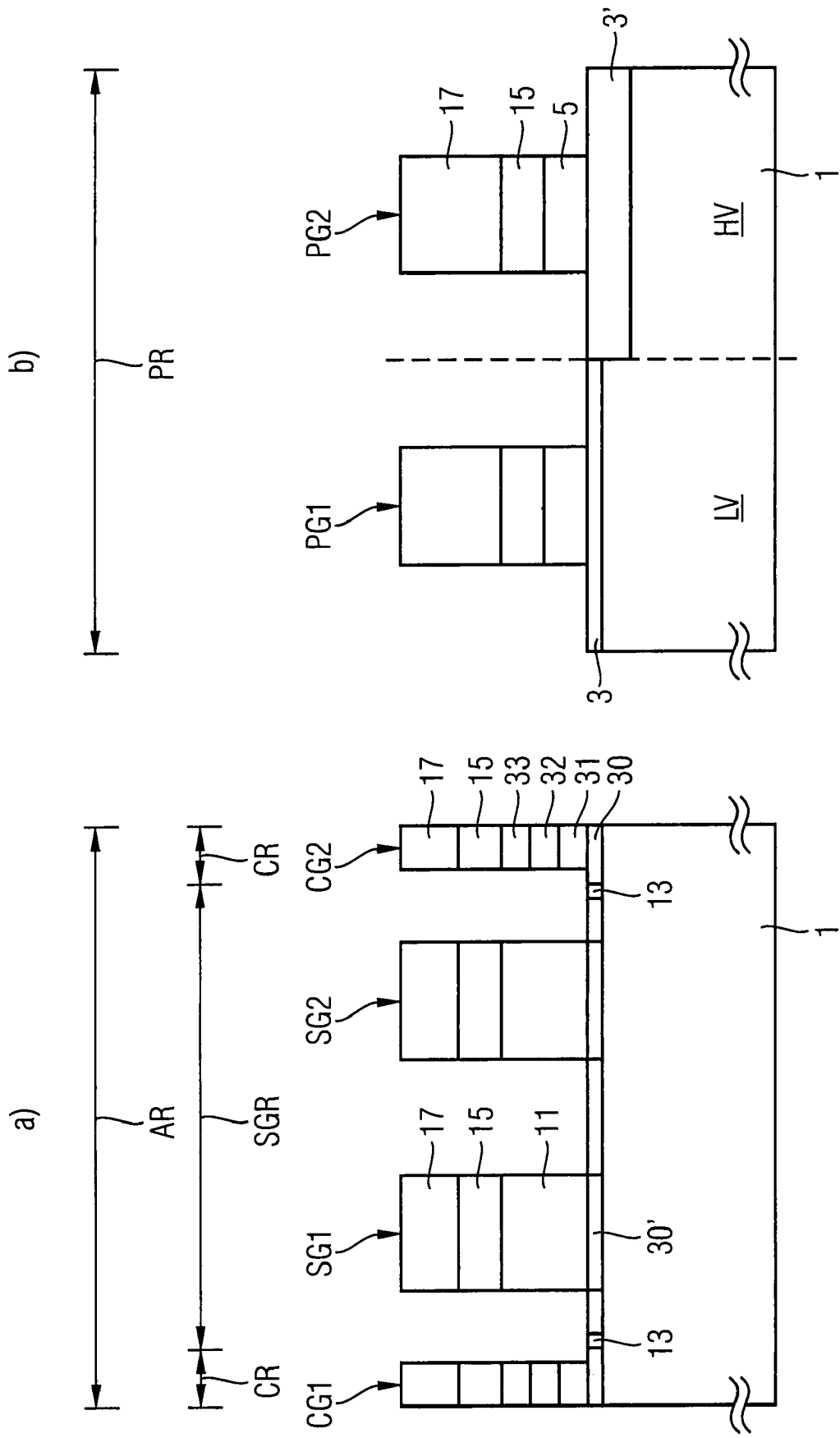

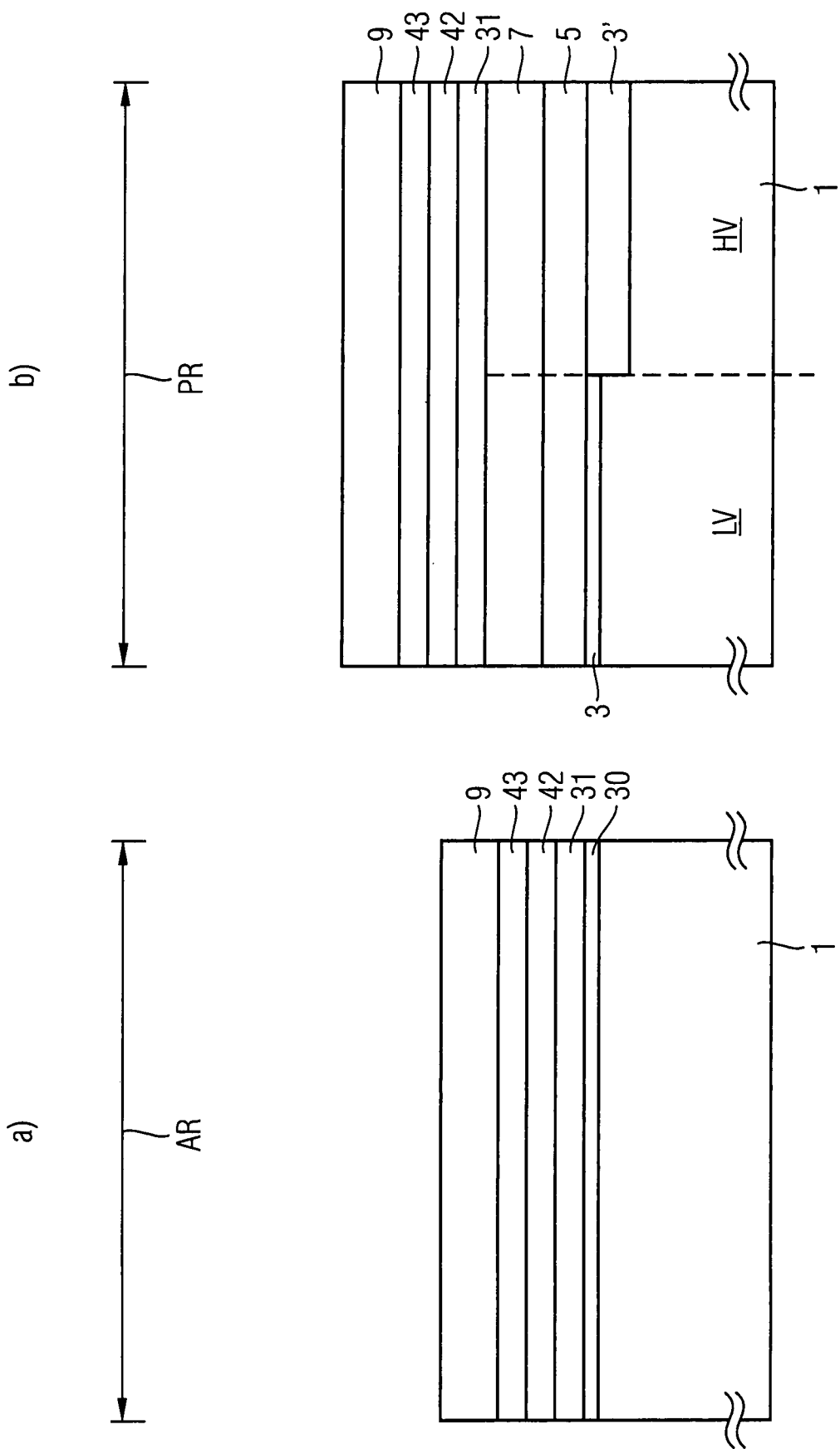

INTEGRATED CIRCUIT INCLUDING DIFFERENT TYPES OF GATE STACKS, CORRESPONDING INTERMEDIATE INTEGRATED CIRCUIT STRUCTURE AND CORRESPONDING INTEGRATED CIRCUIT

BACKGROUND OF THE INVENTION

1. Field of the Invention

The present invention relates to a manufacturing method for an integrated circuit including different types of gate stacks, a corresponding intermediate integrated circuit structure and a corresponding integrated circuit.

2. Description of the Related Art

Non-volatile semiconductor memories are nowadays used in a broad variety of electronic devices such as cellular telephones, digital cameras, personal digital assistants, mobile computing devices, non-mobile computing devices and many other electronic devices.

Electrically erasable programmable read-only memories (EEPROMs) and flash memories are the mainly used non-volatile semiconductor memories.

EEPROMs and flash memories utilize a charge storage region, namely floating gate region or charge trapping region, that is positioned above and insulated from a channel region in a semiconductor substrate. A control gate is provided over and insulated from the floating gate. The floating gate can store charges and can therefore be programmed/erased between two states, i.e., binary "1" and binary "0". Recently, also multi-level non-volatile memory cells have been developed.

As charge storage stacks in non-volatile memories, nowadays SONOS (silicon-oxide-nitride-oxide-silicon) and TANOS (tantal nitride-aluminum oxide-nitride-oxide-silicon) stacks are frequently used. In these stacks, the silicon nitride layer serves as charge storage layer.

In so-called NAND flash memories, NAND strings of non-volatile memory cells are connected in series. One end of such NAND strings is connected to a common bitline and a common source line by respective select transistors having select gates which are different from the charge storage gate stacks of the memory cells.

With increasing integration smaller than 60 nm it becomes more and more a challenging task to have a robust process flow wherein the manufacture of the charge storage stacks, the select gate stacks and the peripheral transistor gate stacks can be easily integrated in the manufacturing steps of the memory.

DESCRIPTION OF THE DRAWINGS

In the Figures:

FIG. 1A-G show schematic layouts for illustrating a manufacturing method and structure of an integrated circuit in form of a memory device according to a first embodiment of the present invention, namely a) as a cross-section of the array region and b) as a cross-section of the periphery region; and FIG. 2 shows a schematic layout for illustrating a manufacturing method and structure of an integrated circuit in form of a memory device according to a second embodiment of the present invention, namely a) as a cross-section of the array region and b) as a cross-section of the periphery region.

In the Figures, identical reference signs denote equivalent or functionally equivalent components.

DESCRIPTION OF THE PREFERRED EMBODIMENTS

FIG. 1A-G show schematic layouts for illustrating a manufacturing method of an integrated circuit in form of a memory device according to a first embodiment of the present invention, namely a) as a cross-section of the array region and b) as a cross-section of the periphery region.

Figure 1A:
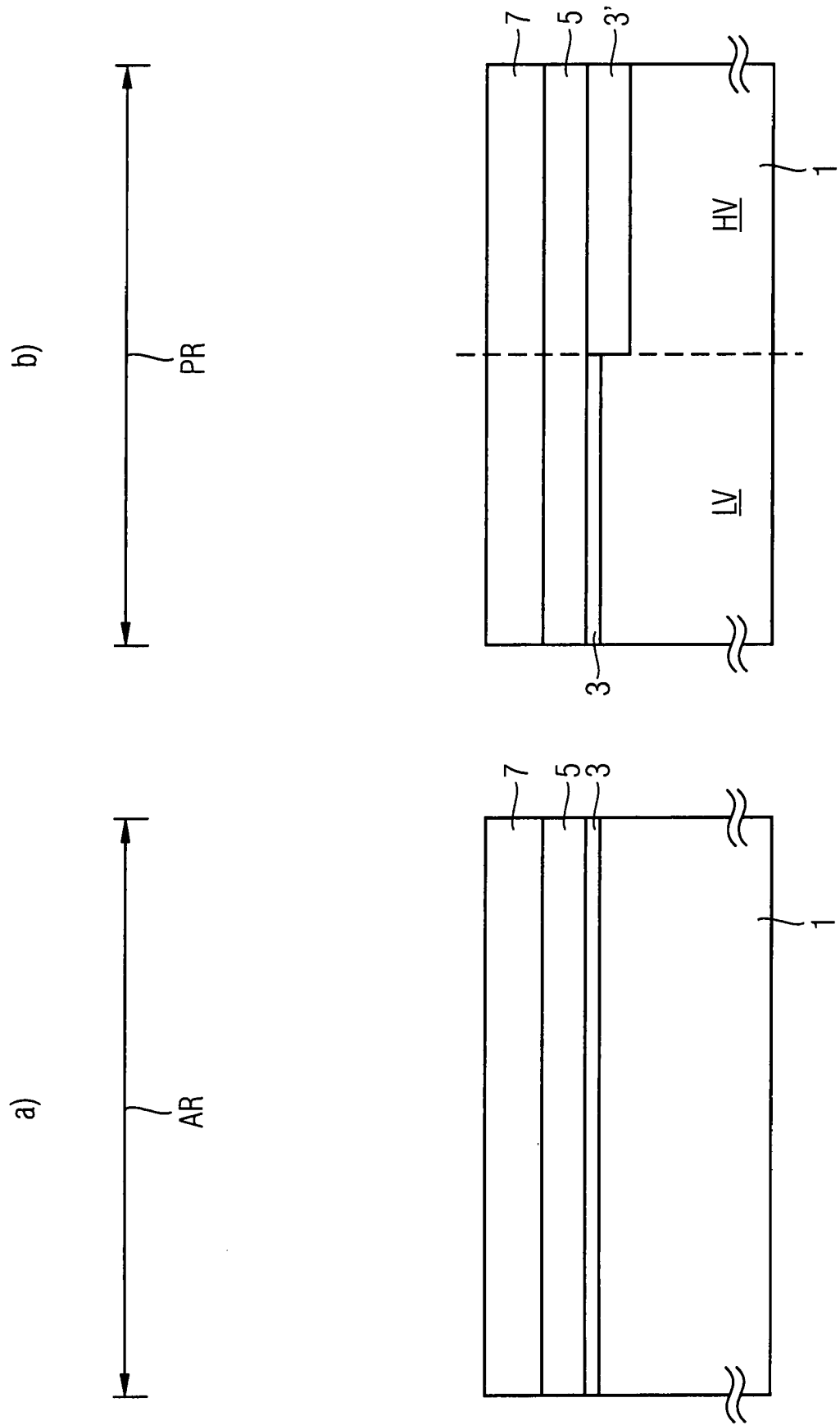

In FIG. 1A reference sign AR denotes an array region of a NAND-type flash memory having an array of NAND strings, whereas reference sign PR denotes a corresponding periphery region including peripheral transistor devices.

In the process status of FIG. 1A, a low-voltage gate dielectric layer 3 has been formed on a silicon semiconductor substrate 1 in the array region AR and in a low-voltage device area LV in the periphery region PR. In a high-voltage device area HV in the periphery region PR, a thicker high-voltage gate dielectric layer 3' has been formed on the silicon semiconductor substrate 1. In the periphery region PR, the low-voltage gate dielectric layer 3 and the high-voltage gate-dielectric layer 3' have a common upper surface.

Both in the array region AR and in the periphery region PR, a first polysilicon layer 5 and a first cap nitride layer 7 have been deposited on the gate dielectric layers 3, 3'.

Starting from the process status of FIG. 1A, a (non-shown) block mask, e.g. made of photoresist, is formed on the periphery region PR. Thereafter, the layers 3, 5, 7 are selectively removed from the array region AR by three appropriate etch steps, i.e. a nitride etch step, a polysilicon etch step, and an oxide etch step.

Thereafter, the (not shown) block mask is removed, and the array region AR and the periphery region are subjected to a TANOS stack forming step sequence.

A thermal silicon oxide gate dielectric layer 30 is grown on the silicon semi-conductor substrate 1 (but not on the first cap nitride layer 7), thereafter a silicon nitride layer 31 as a charge storage layer is deposited on the silicon oxide gate dielectric layer 30. Then, a high-k dielectric $Al_2O_3$ layer 32 is formed on the silicon nitride layer 31, whereafter a control gate electrode layer 33 made of TaN is formed on the $Al_2O_3$ layer 32. Finally, a second cap nitride layer 9 is formed on the TaN control electrode layer 33.

It should be mentioned that the high-k dielectric layer 32 is not limited to $Al_2O_3$, but also high-k dielectric other materials such as HfO, $ZrO_2$, etc. can be used. It should also be mentioned that the control gate electrode layer 33 is not limited to TaN, but also other materials such as TiN, WfN, etc. can be used.

Except for the thermal oxide layer 30, all other layers 31, 32, 33, 9 are also formed above of the first cap nitride layer 7 in the periphery region PR.

Figure 1C:
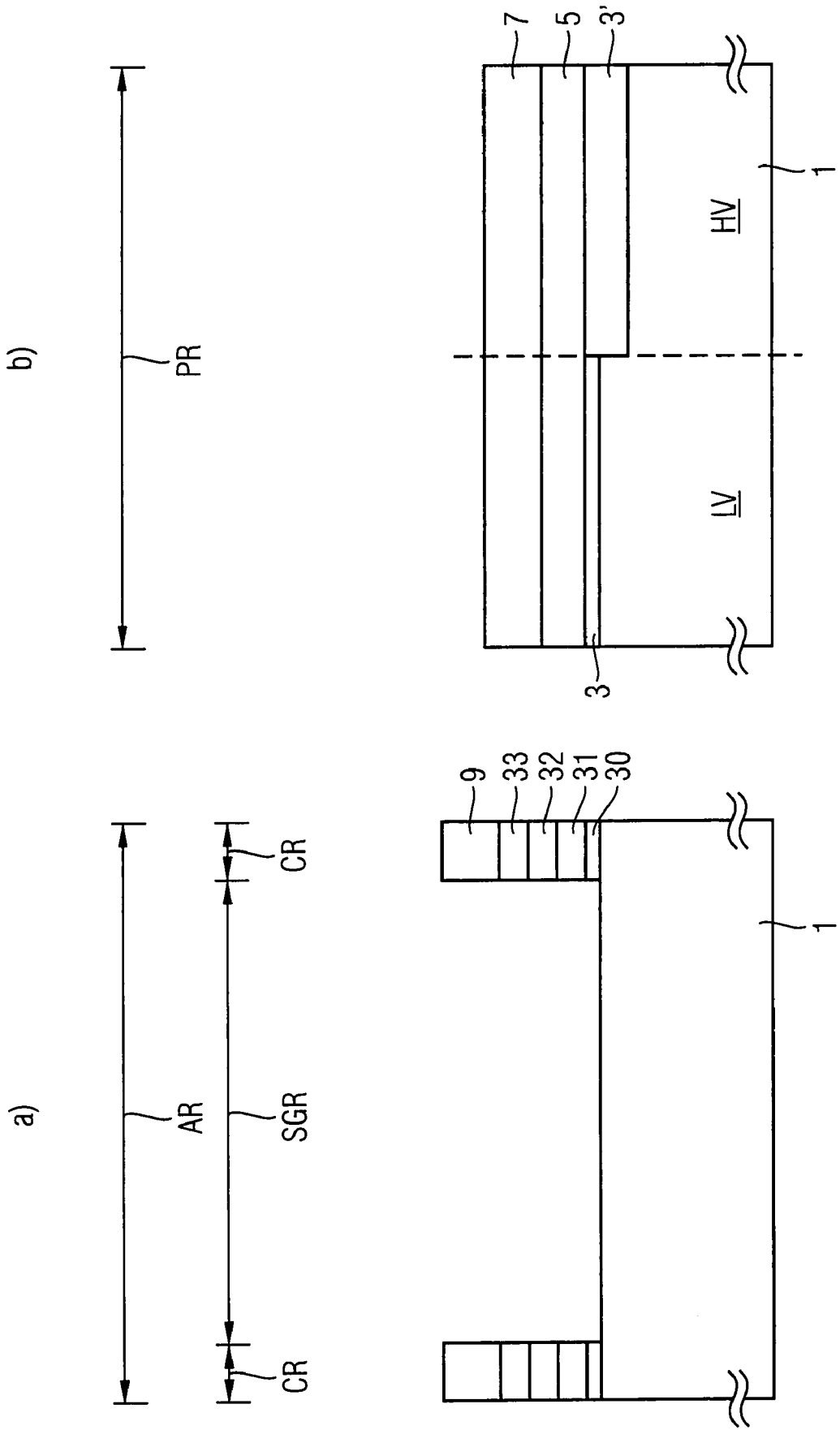

As depicted in FIG. 1C, a (not shown) mask is formed on a cell region CR of the array region AR, exposing a select gate region SGR of the array region AR and exposing said periphery region PR.

Thereafter, the TANOS stack 30, 31, 32, 33 is removed in the select gate region SGR of the array region AR and simultaneously from the first cap nitride layer 7 of the periphery region. In the cell region CR, there remain the non-volatile TANOS gate stacks. Thereafter, the (not shown) mask is removed.

Figure 1D:
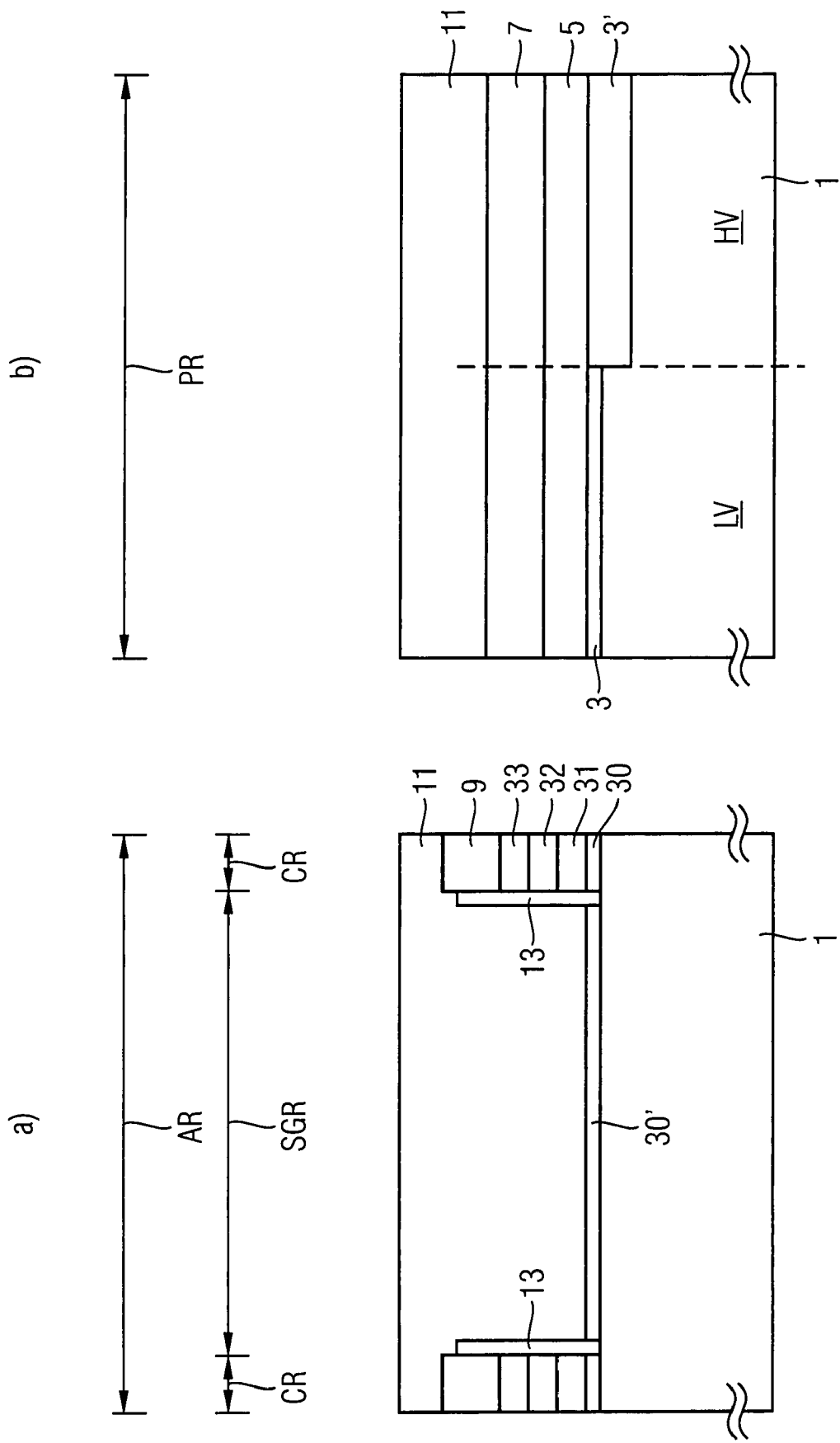

With respect to FIG. 1D, a silicon nitride liner 13 is deposited in the array region AR and in the periphery region PR and subjected to a spacer etch step which leaves sidewall spacers 13 at the sidewalls of the remaining TANOS stacks in the cell region CR. Thereafter, a gate dielectric layer 30', e.g. silicon oxide, is grown in the select gate region SGR as a select gate dielectric layer.

It should be mentioned that the nitride sidewalls spacers 13 protect the sidewalls of the TANOS stacks 30, 31, 32, 33 during the thermal formation of the gate dielectric layer 30'.

Subsequently, a second polysilicon layer 11 is deposited over the array region AR and the periphery region PR and planarized in a CMP step to have a same upper surface level in both regions AR, PR, as may be obtained from FIG. 1D.

As may be obtained from FIG. 1E, the second polysilicon layer 11 is polished to the level of the second cap nitride layer 9 in both regions AR, PR, and thereafter recessed such that it has the same upper surface layer as the TaN layer 33 in the cell region CR.

As shown in FIG. 1F, the second cap nitride layer 9 and the corresponding upper regions of the silicon nitride spacer 13 are then removed in the array region AR, while simultaneously the first cap nitride layer 7 in the periphery region PR is removed in a common nitride etch step.

Thereafter, a tungsten nitride/tungsten layer 15 is deposited over both regions AR, PR, and finally a third cap nitride layer 17 is deposited over both regions AR, PR and planarized in a CMP step, which leads to the process state shown in FIG. 1F.

It should be mentioned that depending on the height of the TANOS stacks 30, 31, 32, 33, it could also be possible that the thickness of the third cap nitride layer 17 is the same in both regions AR, PR.

As shown in FIG. 1G, a (not shown) mask is formed in the array region AR and in the periphery region PR, which mask defines the dimensions of charge-storing cell gate stacks CG1, CG2 in the cell region CR, the dimensions of select gate stacks SG1, SG2 in the select gate region SGR and the dimensions of peripheral device gate stacks PG1, PG2 in the low-voltage and high-voltage device regions LV, HV in the periphery region PR. An etch step using said mask stops on the gate oxide layers 30', 3, 3', respectively. A small part of the liner 13 may also be removed or left on the substrate 1.

Thus, the key elements of a NAND type flash memory, charge storing cell gate stacks CG1, CG2, select gate stacks SG1, SG2, and peripheral device stacks PG1, PG2 have been completed.

For sake of simplicity and because of being well known in the state of the art, the remaining process steps for completing the NAND type flash memory of this example will not be explained here.

FIG. 2 shows a schematic layout for illustrating a manufacturing method of an integrated circuit in form of a memory device according to a second embodiment of the present invention, namely a) as a cross-section of the array region and b) as a cross-section of the periphery region.

In the second embodiment shown in FIG. 2 which corresponds to the process status of FIG. 1B, instead of the TANOS gate stacks 30, 31, 32, 33, SONOS gate stacks 30, 31, 42, 43 have been formed in the array region AR and (except the layer 30) in the periphery region PR.

Here, the layer 30 denotes a thermal gate dielectric oxide layer, 31 a silicon nitride layer as charge storage layer, 42 a silicon oxide layer, and 43 a $p^+$-polysilicon layer as control gate electrode layer.

The remaining process steps after the process status shown in FIG. 2 correspond to the process steps already explained above with respect to FIGS. 1C-1G, and a repeated explanation thereof will be omitted here.

Although the present invention has been described with reference to preferred embodiments, it is not limited thereto, but can be modified in various manners which are obvious for a person skilled in the art. Thus, it is intended that the present invention is only limited by the scope of the claims attached herewith.

Particularly, the present invention is not limited to the material combinations and NAND stack referred to in the above embodiments. Moreover, the invention is applicable for any kind of integrated circuits that use devices having different gate stacks. For example, the select gate stack in the array region can be formed by various other methods.

What is claimed is:

1. Integrated circuit comprising:
   a plurality of first devices, each first device including a charge storage layer and a first control electrode comprising a first plurality of layers; and
   a plurality of second devices coupled to at least one of the plurality of first devices, each second device including a second control electrode comprising a second plurality of layers having at least one layer composed of a different material from said first plurality of layers, and wherein at least two of the first plurality of layers and at least two of the second plurality of layers are, respectively, the same layers.

2. The integrated circuit of claim 1, wherein said plurality of first devices comprises TANOS gate stacks.

3. The integrated circuit of claim 1, wherein said plurality of first devices comprises SONOS gate stacks.

4. The integrated circuit of claim 1, wherein said plurality of second devices does not include a charge storage layer.

5. The integrated circuit of claim 1, wherein the second control electrode of said plurality of second devices includes a polysilicon layer.

6. The integrated circuit of claim 1, wherein the first control electrode of said plurality of first devices and the second control electrode of said plurality of second devices include at least one of a tungsten and a tungsten nitride layer.

7. The integrated circuit of claim 1, wherein said first devices comprise first gate stacks and said second devices comprise second gate stacks.

8. The integrated circuit of claim 1, further comprising a plurality of third devices, each third device including a third control electrode comprising a third plurality of layers, said layers not including a charge storage layer.

9. Memory device including the integrated circuit of claim 1.

10. The memory device of claim 9, wherein said first devices comprise non-volatile memory cells and said second devices comprise select gates and wherein said first and second devices are located in a memory array region.

11. The memory device of claim 9, wherein said plurality of first devices comprises TANOS gate stacks.

12. The memory device of claim 9, wherein said plurality of first devices comprises SONOS gate stacks.

13. The memory device of claim 9, comprising a plurality of third devices, each third device including a third control electrode comprising a third plurality of layers, said layers not including a charge storage layer, wherein said third devices comprise peripheral device gate stacks.

14. Integrated circuit comprising:
   a plurality of first devices, each first device including a charge storage layer and a first control electrode comprising a first plurality of layers; and
   a plurality of second devices coupled to at least one of the plurality of first devices, each second device including a second control electrode comprising a second plurality of layers;
   wherein said first plurality of layers having at least one layer composed of a different material from said second plurality of layers, and wherein at least two of the first plurality of layers and at least two of the second plurality of layers are, respectively, the same layers.

* * * * *